United States Patent
Lin et al.

(10) Patent No.: US 10,460,661 B2
(45) Date of Patent: *Oct. 29, 2019

(54) DISPLAY WITH LIGHT-EMITTING DIODES

(71) Applicant: Apple Inc., Cupertino, CA (US)

(72) Inventors: Chin-Wei Lin, Cupertino, CA (US);
Hung Sheng Lin, San Jose, CA (US);
Shih Chang Chang, Cupertino, CA (US);
Shinya Ono, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/289,007

(22) Filed: Feb. 28, 2019

(65) Prior Publication Data

US 2019/0197954 A1 Jun. 27, 2019

Related U.S. Application Data

(63) Continuation of application No. 15/811,406, filed on Nov. 13, 2017, now Pat. No. 10,354,585, which is a (Continued)

(51) Int. Cl.
*G09G 3/3233* (2016.01)
*H01L 29/786* (2006.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC ........................... G09G 3/3233; G09G 3/3258
(Continued)

(56) References Cited

U.S. PATENT DOCUMENTS

| | | |
|---|---|---|
| 6,919,871 B2 | 7/2005 | Kwon |
| 7,411,571 B2 | 8/2008 | Huh |

(Continued)

FOREIGN PATENT DOCUMENTS

| | | |
|---|---|---|
| CN | 101354864 A | 1/2009 |
| CN | 101449311 A | 6/2009 |

(Continued)

*Primary Examiner* — Calvin C Ma
(74) *Attorney, Agent, or Firm* — Treyz Law Group, P.C.; G. Victor Treyz; Joseph F. Guihan

(57) ABSTRACT

A display may have an array of pixels each of which has a light-emitting diode such as an organic light-emitting diode. A drive transistor and an emission transistor may be coupled in series with the light-emitting diode of each pixel between a positive power supply and a ground power supply. The pixels may include first and second switching transistors. A data storage capacitor may be coupled between a gate and source of the drive transistor in each pixel. Signal lines may be provided in columns of pixels to route signals such as data signals, sensed drive currents from the drive transistors, and predetermined voltages between display driver circuitry and the pixels. The switching transistors, emission transistors, and drive transistors may include semiconducting-oxide transistors and silicon transistors and may be n-channel transistors or p-channel transistors.

20 Claims, 18 Drawing Sheets

Related U.S. Application Data continuation of application No. 15/263,803, filed on Sep. 13, 2016, now Pat. No. 9,818,344.

(60) Provisional application No. 62/263,074, filed on Dec. 4, 2015.

(51) Int. Cl.
    *G09G 3/3266* (2016.01)
    *G09G 3/3275* (2016.01)
    *H01L 27/12* (2006.01)

(52) U.S. Cl.
    CPC ...... *H01L 27/1225* (2013.01); *H01L 29/7869* (2013.01); *H01L 29/78651* (2013.01); *G09G 2300/0842* (2013.01); *G09G 2300/0861* (2013.01); *G09G 2310/0202* (2013.01); *G09G 2320/0295* (2013.01); *G09G 2320/043* (2013.01)

(58) Field of Classification Search
    USPC ................... 345/76, 690; 438/104
    See application file for complete search history.

(56) References Cited

U.S. PATENT DOCUMENTS

| | | | |
|---|---|---|---|
| 8,289,234 B2 | 10/2012 | Kim | |
| 8,890,220 B2 | 11/2014 | Nathan et al. | |
| 8,941,697 B2 | 1/2015 | Nathan et al. | |
| 8,993,126 B2 | 3/2015 | Nowatari et al. | |
| 9,818,344 B2 * | 11/2017 | Lin | G09G 3/3233 |
| 2007/0040770 A1 | 2/2007 | Kim | |
| 2007/0236424 A1 * | 10/2007 | Kimura | G09G 3/3233 345/76 |
| 2009/0002731 A1 | 1/2009 | Miyamoto et al. | |
| 2009/0114918 A1 | 5/2009 | Wang et al. | |
| 2010/0220117 A1 | 9/2010 | Kimura | |
| 2012/0001896 A1 * | 1/2012 | Han | G09G 3/3233 345/214 |
| 2012/0026147 A1 | 2/2012 | Komiya | |
| 2012/0006253 A1 | 3/2012 | Park | |
| 2012/0147060 A1 | 6/2012 | Jeong | |
| 2013/0020795 A1 | 8/2013 | Lin et al. | |
| 2014/0018466 A1 | 7/2014 | Yoon et al. | |
| 2014/0320544 A1 | 10/2014 | Kim | |
| 2014/0346475 A1 * | 11/2014 | Cho | H01L 27/326 257/40 |
| 2015/0007741 A1 | 3/2015 | Miyake | |
| 2015/0109279 A1 | 4/2015 | Gupta et al. | |
| 2015/0123557 A1 | 5/2015 | Lee et al. | |
| 2015/0213757 A1 | 7/2015 | Takahama et al. | |
| 2015/0248856 A1 | 9/2015 | Kishi et al. | |
| 2017/0011005 A1 | 4/2017 | Kuo | |

FOREIGN PATENT DOCUMENTS

| | | |
|---|---|---|
| CN | 101958339 A | 1/2011 |
| CN | 102222468 A | 10/2011 |
| CN | 103000632 A | 3/2013 |
| CN | 103839517 A | 6/2014 |
| CN | 104064149 A | 9/2014 |
| CN | 104332485 A | 2/2015 |
| CN | 204167325 U | 2/2015 |
| JP | 2005195756 A | 7/2005 |
| JP | 2009025735 A | 2/2009 |
| JP | 2011107685 A | 6/2011 |
| JP | 2012063734 A | 3/2012 |
| JP | 2012098316 A | 5/2012 |
| JP | 2015079241 A | 4/2015 |
| KR | 10-20130074147 A | 7/2013 |

* cited by examiner

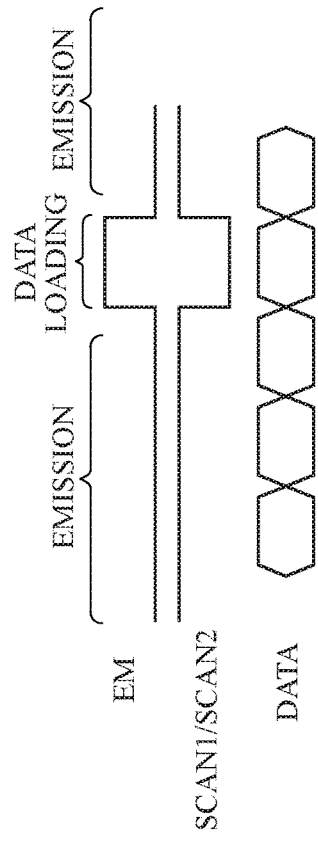
FIG. 2
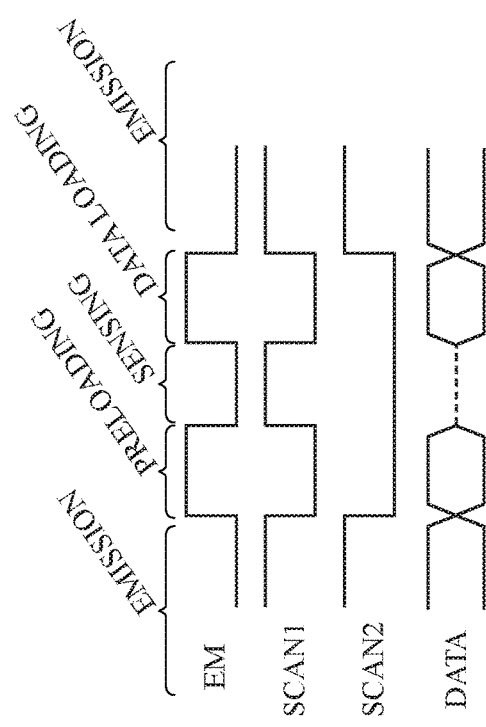
FIG. 3
FIG. 4

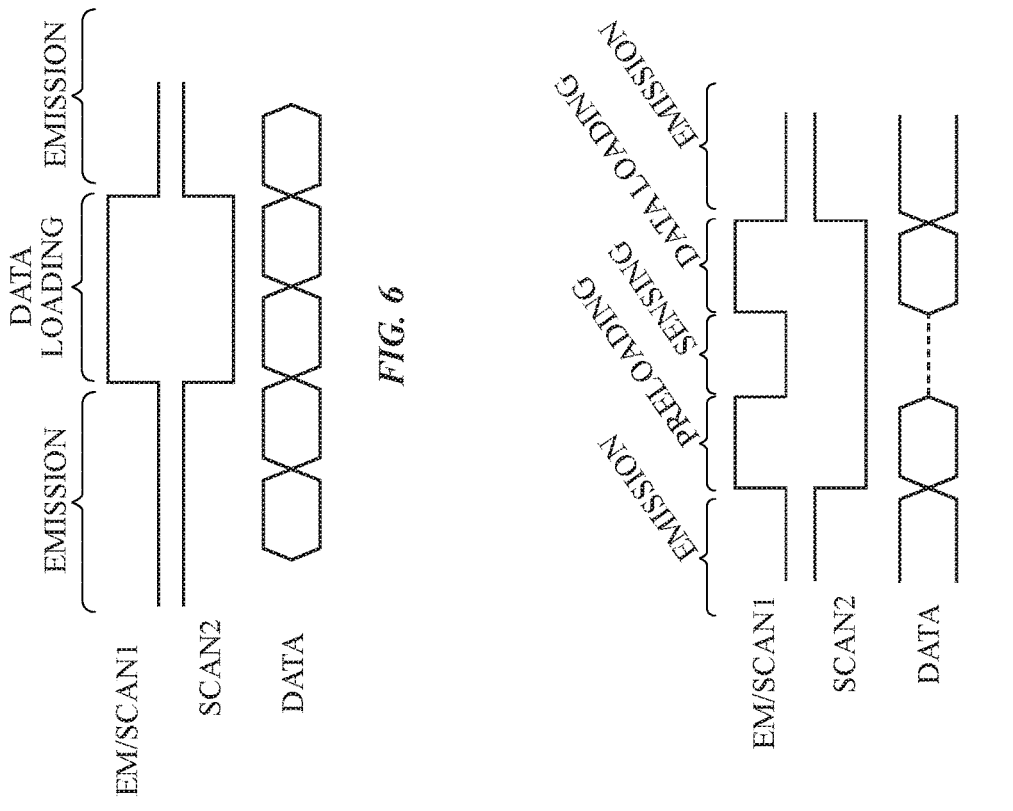
FIG. 6
FIG. 7
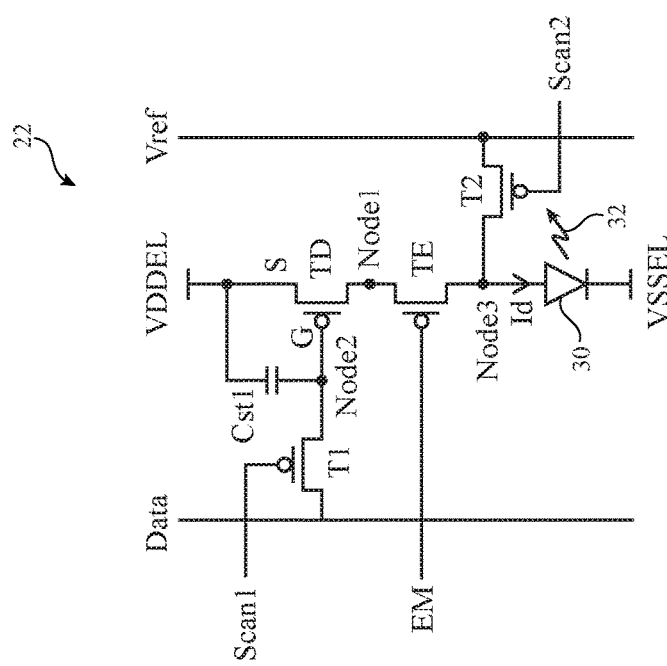
FIG. 5

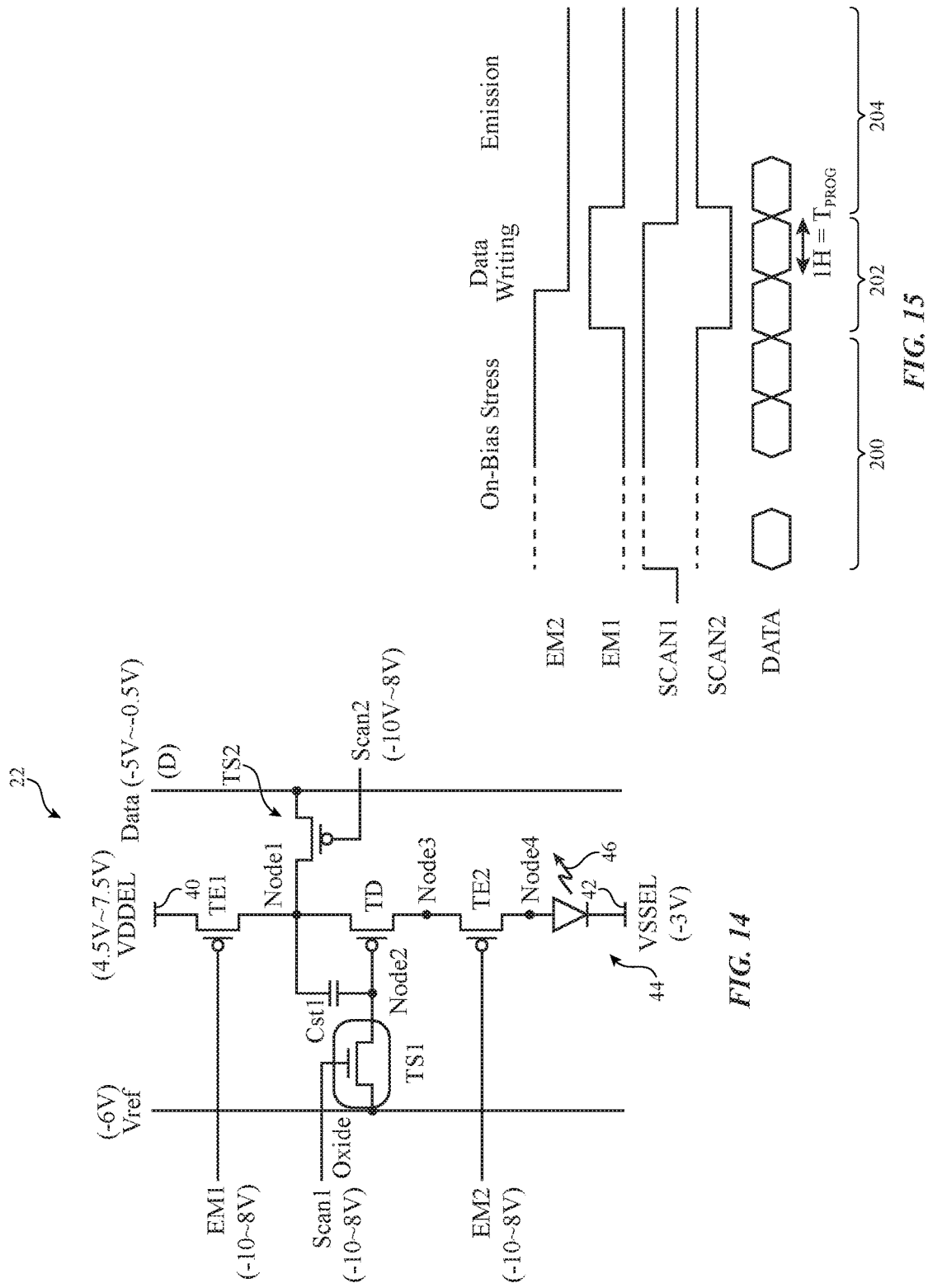

DISPLAY WITH LIGHT-EMITTING DIODES

This application is a continuation of U.S. patent application Ser. No. 15/811,406, filed Nov. 13, 2017, which is a continuation of U.S. patent application Ser. No. 15/263,803, filed Sep. 13, 2016, now U.S. Pat. No. 9,818,344, which claims the benefit of U.S. provisional patent application No. 62/263,074, filed Dec. 4, 2015, which are hereby incorporated by reference herein in their entireties. This application claims the benefit of and claims priority to U.S. patent application Ser. No. 15/811,406, filed Nov. 13, 2017, U.S. patent application Ser. No. 15/263,803, filed Sep. 13, 2016, now U.S. Pat. No. 9,818,344, and U.S. provisional patent application No. 62/263,074, filed Dec. 4, 2015.

BACKGROUND

This relates generally to electronic devices, and, more particularly, to electronic devices with displays.

Electronic devices often include displays. Displays such as organic light-emitting diode displays have pixels with light-emitting diodes.

It can be challenging to design displays with light-emitting diodes. If care is not taken, high transistor leakage currents, slow transistor switching speeds, routing complexity, voltage drops due to ohmic losses, and other issues may adversely affect display performance.

SUMMARY

An electronic device may have a display. The display may have an array of pixels organized in rows and columns. Each of the pixels may have a light-emitting diode such as an organic light-emitting diode that emits light in response to application of a drive current. A drive transistor in each pixel may supply the drive current to the light-emitting diode of that pixel in response to a gate-source voltage across a gate and source of the drive transistor.

The source of each drive transistor may be coupled to a positive power supply. An emission transistor may be coupled in series with the drive transistor and the light-emitting diode of each pixel between the positive power supply and a ground power supply. The pixels may include first and second switching transistors. A data storage capacitor may be coupled between the gate and the source of the drive transistor in each pixel. Control signals may be provided to gates of the switching transistors and the emission transistor from display driver circuitry.

Signal lines may be provided in columns of pixels to route signals such as data signals, sensed drive currents from the drive transistors, and predetermined voltages such as reference voltages between the display driver circuitry and the pixels. The switching transistors, emission transistors, and drive transistors may include semiconducting-oxide transistors and silicon transistors and may be n-channel transistors or p-channel transistors.

Further features will be more apparent from the accompanying drawings and the following detailed description.

BRIEF DESCRIPTION OF THE DRAWINGS

FIG. 2 is a circuit diagram of an illustrative pixel for a display in accordance with an embodiment.

FIGS. 3 and 4 are timing diagrams showing illustrative signals involved in operating a display with pixels of the type shown in FIG. 2 in accordance with an embodiment.

FIG. 5 is a circuit diagram of another illustrative pixel for a display in accordance with an embodiment.

FIGS. 6 and 7 are timing diagrams showing illustrative signals involved in operating a display with pixels of the type shown in FIG. 5 in accordance with an embodiment.

FIG. 14 is a diagram of an illustrative pixel circuit with five transistors and one capacitor in accordance with an embodiment.

FIG. 15 is a timing diagram showing signals involved in operating a display with pixels of the type shown in FIG. 14 in accordance with an embodiment.

DETAILED DESCRIPTION

Figure 1:
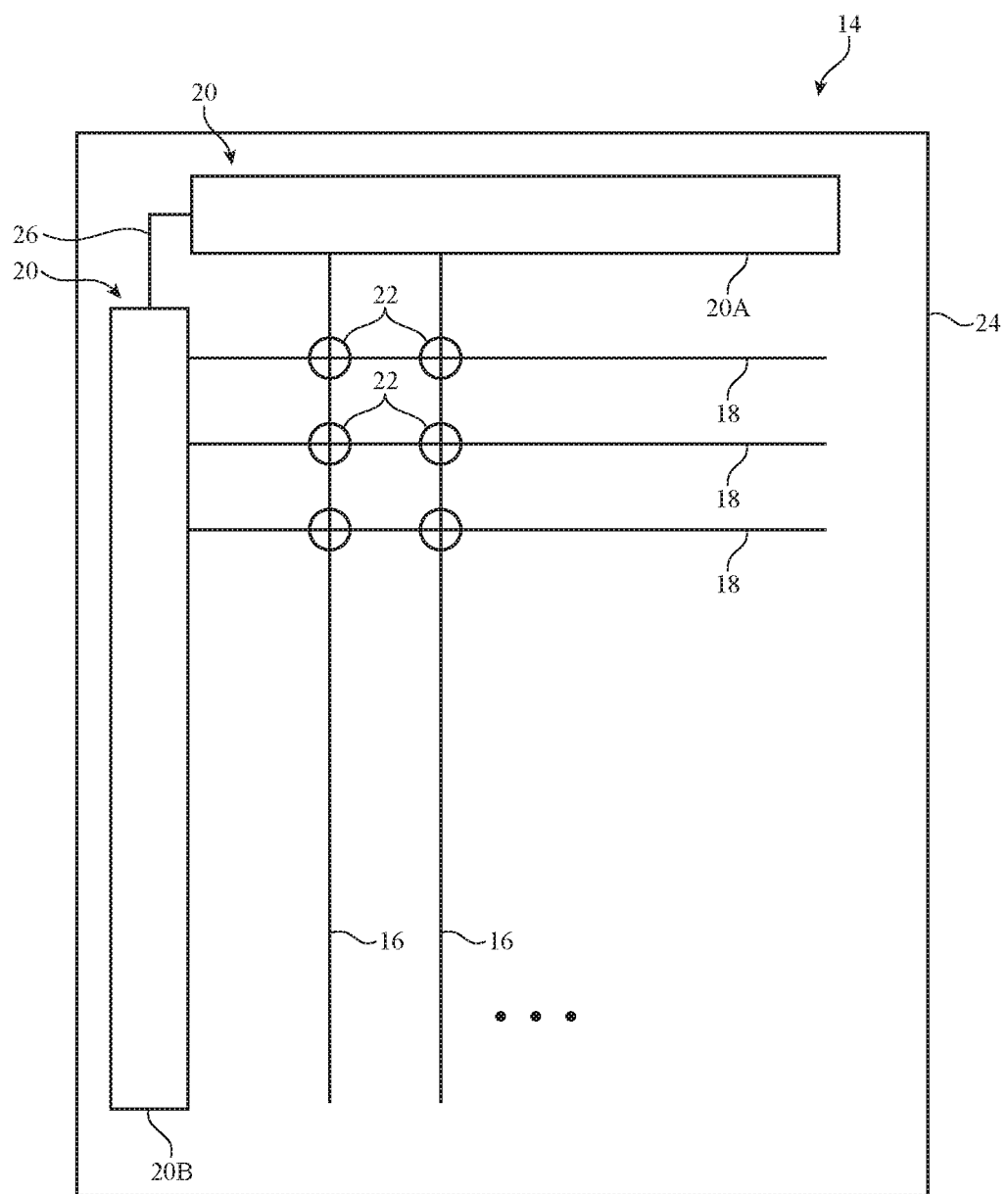
FIG. 1 is a schematic diagram of an illustrative display in accordance with an embodiment.

Displays such as display 14 of FIG. 1 may be used in devices such as tablet computers, laptop computers, desktop computers, displays, cellular telephones, media players, wristwatch devices or other wearable electronic equipment, or other suitable electronic devices.

Display 14 may be an organic light-emitting diode display or may be a display based on other types of display technology (e.g., displays with light-emitting diodes formed from discrete crystalline semiconductor dies, displays with quantum dot light-emitting diodes, etc.). Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

As shown in FIG. 2, display 14 may have an array of pixels 22 formed on substrate 24. Substrate 24 may be formed from glass, metal, plastic, ceramic, or other substrate materials. Pixels 22 may receive data signals and other signals over paths such as vertical paths 16. Each vertical path 16 may be associated with a respective column of pixels 22 and may contain one or more signal lines. Pixels 22 may receive horizontal control signals (sometimes referred to as emission enable control signals or emission signals, scan signals, or gate signals) over paths such as horizontal paths 18. Each horizontal path 18 may contain one or more horizontal signal lines.

There may be any suitable number of rows and columns of pixels 22 in display 14 (e.g., tens or more, hundreds or more, or thousands or more). Each pixel 22 may have a light-emitting diode that emits light under the control of a pixel circuit formed from thin-film transistor circuitry (e.g., thin-film transistors, thin-film capacitors, etc.). The thin-film transistor circuitry of pixels 22 may include silicon thin-film transistors such as polysilicon thin-film transistors, semiconducting-oxide thin-film transistors such as indium gallium zinc oxide transistors, or thin-film transistors formed from other semiconductors. Pixels 22 may contain light-emitting diodes of different colors (e.g., red, green, and blue diodes for red, green, and blue pixels, respectively) to provide display 14 with the ability to display color images.

Pixels 22 may be arranged in a rectangular array or an array of other shapes. The array of pixels 22 forms an active area for display 14 and is used in displaying images for a user. Inactive portions of display 14 may run along one or more of the edges of active area AA. Inactive areas form borders for display 14 and may be free of pixels 22.

Display driver circuitry 20 may be used to control the operation of pixels 22. Display driver circuitry 20 may be formed from integrated circuits, thin-film transistor circuits, or other suitable circuitry and may be located in the inactive area of display 14. Display driver circuitry 20 may contain communications circuitry for communicating with system control circuitry such as a microprocessor, storage, and other storage and processing circuitry. During operation, the system control circuitry may supply circuitry 20 with information on images to be displayed on display 14.

To display the images on pixels 22, display driver circuitry such as circuitry 20A may supply image data to vertical lines 16 while issuing clock signals and other control signals to supporting display driver circuitry such as display driver circuitry 20B (e.g., gate driver circuitry) over path 26. If desired, circuitry 20 may also supply clock signals and other control signals to gate driver circuitry 20B on an opposing edge of display 14.

Gate driver circuitry 20B (sometimes referred to as horizontal control line control circuitry) may be implemented as part of an integrated circuit and/or may be implemented using thin-film transistor circuitry. Horizontal control lines 18 in display 14 may carry gate line signals (e.g., scan line signals, emission enable control signals, and other horizontal control signals) for controlling the pixels of each row. There may be any suitable number of horizontal control signals per row of pixels 22 (e.g., one or more, two or more, three or more, four or more, etc.).

Pixels 22 may each include a drive transistor coupled in series with a light-emitting diode. An emission enable transistor (emission transistor) may be coupled in series with the drive transistor and light-emitting diode between positive and ground power supply terminals. A storage capacitor in each pixel may be used to store loaded data (e.g., data establishing a pixel brightness value for the pixel) between successive image frames. Each pixel may also have one or more switching transistors to support data loading operations and other operations.

The frame rate of display 14 may be 60 Hz or other suitable frame rate. If desired, display 14 may support variable refresh rate operations. During normal refresh rate operations, the refresh rate of display 14 may be relatively high (e.g., 60 Hz). When static content is being displayed on display 14, the refresh rate of display 14 may be lowered (e.g., to 1-5 Hz or other suitable low refresh rate) to conserve power.

The circuitry of pixels 22 (e.g., transistors such as drive transistors, light-emitting diodes, etc.) may be influenced by aging effects. Display driver circuitry 20 (e.g., circuitry 20A) may contain current sensing circuitry and other compensation circuitry that periodically measures the performance of pixels 22. Based on these periodic measurements (e.g., periodic current sensing measurements to measure the current produced by the drive transistors of the pixels), display driver circuitry 20 may make adjustments to the data that is loaded into pixels 22. The adjustments that are made to the loaded pixel data may compensate for measured pixel performance variations (e.g., the adjustments may compensate for aging effects, thereby ensuring that display 14 exhibits a desired uniformity and other attributes). Current sensing (e.g., sensing of the current of drive transistors in pixels 22) may be performed using vertical lines in display 14 such as lines 16. During normal operation (sometimes referred to as the "emission" mode of display 14), emission control lines can be asserted to turn on the emission enable transistors in pixels 22. The emission enable transistors may be turned off during data loading and current sensing operations.

Pixels 22 may use both semiconducting-oxide transistors and silicon transistors. Semiconducting-oxide transistors tend to exhibit lower leakage current than silicon transistors. Silicon transistors tend to switch more quickly than semiconducting-oxide transistors. By appropriate selection of which transistors in each pixel are semiconducting-oxide transistors and which transistors in each pixel are silicon transistors and by configuring the horizontal lines, vertical lines, and other pixel circuitry appropriately, display performance can be optimized. FIGS. 2-13 show various pixel circuit arrangements and associated signal timing diagrams associated with illustrative embodiments for display 14.

As shown in the illustrative configuration for pixel 22 of FIG. 2, each pixel 22 may contain a light-emitting diode such as light-emitting diode 30 that emits light 32 in response to application of drive current Id. Light-emitting diode 30 may be, for example, an organic light-emitting diode. The transistors and capacitor structures of pixels 22 may be formed from thin-film circuitry on substrate 24 (FIG. 1). In general, each pixel 22 of display 14 may include p-channel transistors, n-channel transistors, semiconducting-oxide transistors, silicon transistors, one or more storage capacitors, and signal paths (e.g., portions of one or more vertical signal lines, and one or more horizontal signal lines).

In the example of FIG. 2, light-emitting diode 30 is coupled in series with emission enable transistor (emission transistor) TE and drive transistor TD between positive power supply Vdde1 and ground power supply Vsse1. Storage capacitor Cst1 maintains a loaded data value on Node2, which is connected to the gate of drive transistor TD. Source S of drive transistor TD is coupled to positive power supply Vdde1. The value of the gate-source voltage Vgs of drive transistor TD (i.e., the voltage difference between Node2 and power supply terminal Vdde1 at source S of transistor TD) establishes the drive current Id through light-emitting diode 30. Emission is enabled or disabled using emission control signal EM, which is applied to the gate of emission transistor TE. Switching transistors T1 and T2 are used for data loading and current sensing operations. Transistors T1, T2, TD, and TE may all be p-channel silicon transistors (as an example).

Each column of pixels 22 such as pixel 22 of FIG. 2 may be associated with a pair of vertical signal lines 16. The vertical signal lines may include a data line (Data) and a reference voltage line (Vref). The data line may be used to load data onto data storage capacitor Cst1. The reference voltage line, which may sometimes be referred to as a sense line, may be used to measure the current of drive transistor TD (e.g., to assess aging) during current sensing operations. The reference voltage line may also be used in loading predetermined voltages onto a node between emission transistor TE and light-emitting diode 30 (i.e., Node3).

Each row of pixels 22 such as pixel 22 of FIG. 2 may be associated with three horizontal signal lines 18. The horizontal signal lines 18 may include a first switching transistor control signal (scan signal) Scan1 that is applied to the gate of switching transistor T1, a second switching transistor control signal (scan signal) Scan2 that is applied to the gate of switching transistor T2, and an emission enable signal (emission signal) EM that is applied to the gate of emission transistor TE.

A signal timing diagram showing signals associated with loading data from data line Data onto storage capacitor Cst1 at Node2 of pixel 22 of FIG. 2 is shown in FIG. 3. During normal operation (emission operations), EM is held low by display driver circuitry 20B, so transistor TE is on. With TE on, the data value on node Node2 establishes a desired Vgs value across gate G and source S of drive transistor TD (Source S is tied to Vdde1), thereby setting the magnitude of drive current Id for light-emitting diode 30. During data loading operations, EM is taken high by circuitry 20B to turn off transistor TE and block current Id. While EM is high, circuitry 20B takes signals Scan1 and Scan2 low to turn on transistors T1 and T2. With T2 on, a known reference voltage may be supplied to Node3 from line Vref. With T1 on, the current data signal on the data line (Data) may be loaded onto capacitor Cst1 at Node2. Emission operations may then be resumed by taking EM low and taking Scan1 and Scan2 high. During emission, the data value loaded onto capacitor Cst1 at Node2 determines the output level of light 32 from light-emitting diode 30.

A signal timing diagram showing signals associated with current sensing operations (which may be performed periodically such as once per hour, once per week, etc. by interrupting normal emission operations) is shown in FIG. 4.

During preloading, EM is taken high to prevent current from flowing through light-emitting diode 30 while Scan1 and Scan2 are taken low. While Scan2 is low, transistor T2 is turned on and a known reference voltage is loaded onto Node3 from line Vref. While Scan1 is low, known reference data ("sense data") is loaded from line Data onto Node2, via transistor T1, which is on. This establishes known conditions for operating drive transistor TD (e.g., a predetermined Vgs value and predetermined voltage on Node3).

After loading pixel 22 with sense data, current sensing operations are performed. During sensing operations, EM is taken low and Scan2 is held low while Scan1 is taken high. This routes the current that is flowing through drive transistor TD into line Vref, which then serves as a sense line. Current sensing circuitry within the compensation circuits of display driver circuitry 20B measures the amount of current flowing through transistor TD so that the performance of transistor TD may be assessed. The compensation circuitry of display driver circuitry 20B can use current measurements such as these to compensate pixels 22 for aging effects (e.g., aging that affects the amount of drive current Id that transistor TD produces for a given Vgs value).

After current sensing operations are complete, data may be loaded from data line Data onto Node2 by taking EM high, taking Scan1 low to turn on transistor T1, and holding Scan2 low. Pixel 22 may be placed in emission mode after data has been loaded by taking EM low to turn on transistor TE and taking Scan1 and Scan2 high to turn off transistors T1 and T2.

The configuration for pixel 22 of FIG. 2 uses three gate control signals on three horizontal control lines in ear row of pixels 22 and routes data, reference voltage signals, and current measurements over two vertical lines in each column of pixels 22. The vertical lines of each column operate independently of the vertical lines of the other columns (i.e., there are N independent lines Data and N independent lines Vref in a display having N columns of pixels 22).

To reduce transistor leakage current and thereby allow display 14 to be operated efficiently at a low refresh rate (e.g., when display 14 is configured to support variable refresh rate operation), pixel 22 may be provided with a semiconducting-oxide switching transistor. For example, data loading transistor T1 of pixel 22 of FIG. 5 may be an n-channel semiconducting-oxide transistor. Transistors TE, TD, and T2 may be p-channel silicon transistors.

A signal timing diagram showing signals associated with loading data from data line Data onto storage capacitor Cst1 at Node2 in pixel 22 of FIG. 5 is shown in FIG. 6.

During normal operation (emission operations) of pixel 22 of FIG. 5, EM is held low by display driver circuitry 20B, so transistor TE is on. Source S of drive transistor TD is at Vdde1. With TE on, the data value on node Node2 establishes a desired gate-source voltage Vgs value across gate G and source S of drive transistor TD, thereby setting the magnitude of drive current Id for light-emitting diode 30.

During data loading operations, EM is taken high by circuitry 20B to turn off transistor TE and block current Id. While EM is high, circuitry 20B takes signal Scan1 high and takes Scan2 low to turn on transistors T1 and T2. Transistor T1 is a semiconducting-oxide transistor, so it may be desirable to extend the amount of time that Scan1 is high (relative to a scenario in which T1 is a silicon transistor) to ensure sufficient time for the transistor T1 to settle. With T2 on for data loading, a known reference voltage may be supplied to Node3 from line Vref. With T1 on, the data signal that is present on the data line (Data) may be loaded onto capacitor Cst1 at Node2. Emission operations may then be resumed by taking EM and Scan1 low and taking Scan2 high.

A signal timing diagram showing signals associated with periodic current sensing operations for pixel 22 of FIG. 5 is shown in FIG. 7.

During preloading of pixel 22 of FIG. 5, EM is taken high to prevent current from flowing through light-emitting diode 30, while Scan1 is taken high and Scan2 is taken low. With Scan2 low, transistor T2 is turned on and a known reference voltage is loaded onto Node3 from line Vref. With Scan1 high, known reference data ("sense data") is loaded from line Data onto Node2, via transistor T1, which is on. This establishes known conditions for operating drive transistor TD (e.g., a predetermined Vgs value and predetermined voltage on Node3).

During sensing operations for pixel 22 of FIG. 5, EM and Scan1 are taken low and Scan2 is held low. This routes the current that is flowing through drive transistor TD into line Vref, which serves as a sense line. Current sensing circuitry within the compensation circuits of display driver circuitry 20B measures the amount of current flowing through transistor TD so that the performance of transistor TD may be assessed. As with the scenario of FIG. 2, the compensation circuitry of display driver circuitry 20B can use current measurements such as these to compensate pixels 22 of FIG. 5 for aging effects (e.g., aging that affects the amount of drive current Id that transistor TD produces for a given Vgs value).

After sensing operations are complete, data may be loaded from data line Data onto Node2 by taking EM and Scan1 high while holding Scan2 low. Pixel 22 may be placed in emission mode after data has been loaded by taking EM and Scan1 low and taking Scan2 high, thereby turning on transistor TE and turning off transistors T1 and T2.

Because the EM and Scan1 signals are identical, the functions of these signals can be implemented using a single combined signal that is carried on a single signal lines (i.e., a single signal EM/Scan1 can replace the separately adjusted EM and Scan1 signals of pixel 22 of FIG. 2). The configuration for pixel 22 of FIG. 5 therefore uses only two gate control signals on two horizontal control lines, saving routing resources. Two vertical lines (Data and Vref) may be used to carry data, reference voltage signals, and current measurements in each column of pixels 22. The vertical lines of each column of a display with pixels 22 of the type shown in FIG. 5 operate independently of the vertical lines of the other columns (i.e., there are N independent lines Data and N independent lines Vref in a display having N columns of pixels 22).

Figures 8, 9, 10:
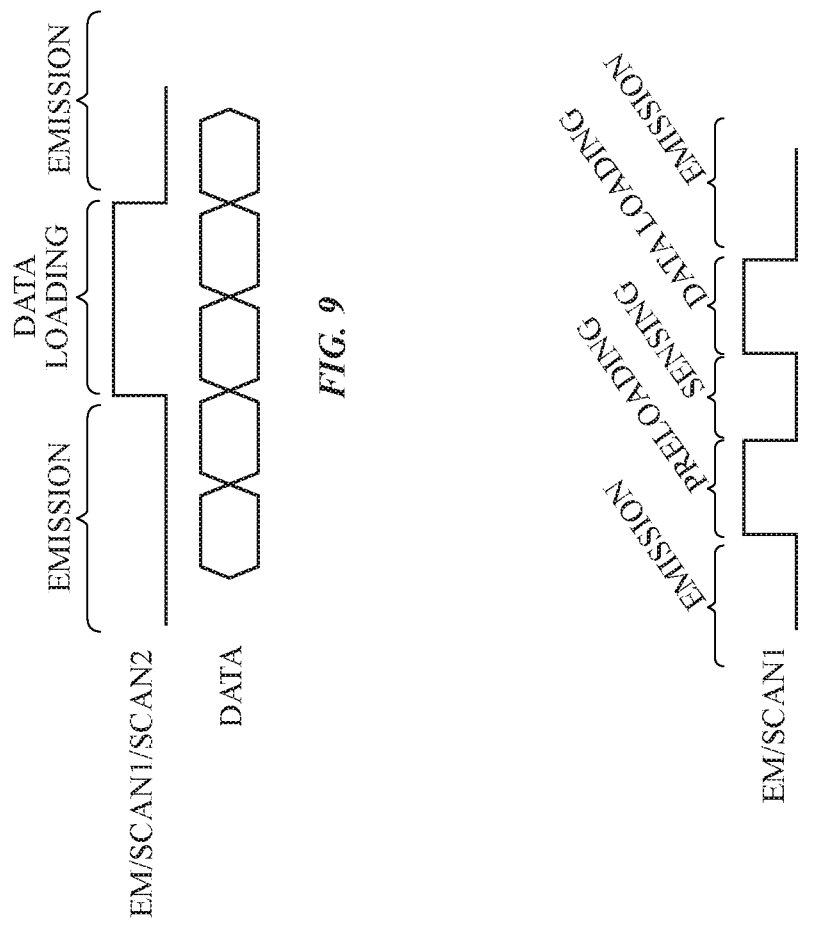
FIG. 8 is a circuit diagram of an additional illustrative pixel for a display in accordance with an embodiment.
FIGS. 9 and 10 are timing diagrams showing illustrative signals involved in operating a display with pixels of the type shown in FIG. 8 in accordance with an embodiment.

If desired, the number of horizontal control signals that are associated with each row of pixels 22 can be reduced further using circuitry of the type shown in pixel 22 of FIG. 8. In the configuration of FIG. 8, transistors T1 and T2 are both n-channel semiconducting-oxide transistors, whereas transistors TE and TD are both p-channel silicon transistors. The use of semiconducting-oxide transistors in pixel 22 (e.g., for transistors T1) helps to reduce leakage current and thereby allow display 14 to be operated efficiently at a low refresh rate (e.g., when display 14 is configured to support variable refresh rate operation).

A signal timing diagram showing signals associated with loading data from data line Data onto storage capacitor Cst1 at Node2 in pixel 22 of FIG. 8 is shown in FIG. 9.

During normal operation (emission operations) of pixel 22 of FIG. 8, EM is held low by display driver circuitry 20B, so transistor TE is on. With TE on, the data value on node Node2 establishes a desired Vgs value across gate G and source S of drive transistor TD, thereby setting the magnitude of drive current Id for light-emitting diode 30. Signals Scan1 and Scan2 may be held low during emission to turn off transistors T1 and T2 during emission.

During data loading operations, EM is taken high by circuitry 20B to turn off transistor TE and block current Id. While EM is high, circuitry 20B takes signals Scan1 and Scan2 high to turn on transistors T1 and T2. Transistor T1 is a semiconducting-oxide transistor, so it may be desirable to extend the amount of time that Scan1 is high (relative to a scenario in which T1 is a silicon transistor) to ensure sufficient time for the transistor T1 to settle. With T2 on for data loading, a known reference voltage may be supplied to Node3 between transistor TE and light-emitting diode 30 from line Vref. With T1 on, the data signal that is present on the data line (Data) may be loaded onto capacitor Cst1 at Node2. Emission operations may then be resumed by taking EM, Scan1, and Scan2 low.

A signal timing diagram showing signals associated with periodic current sensing operations for pixel 22 of FIG. 8 is shown in FIG. 10.

During preloading of pixel 22 of FIG. 8, EM is taken high to prevent current from flowing through light-emitting diode 30, while Scan1 and Scan2 are taken high. With Scan2 high, transistor T2 is turned on and a known reference voltage is loaded onto Node3 from line Vref. With Scan1 high, known reference data ("sense data") is loaded from line Data onto Node2, via transistor T1, which is on. This establishes known conditions for operating drive transistor TD (e.g., a predetermined Vgs value and predetermined voltage on Node3).

During sensing operations for pixel 22 of FIG. 8, EM and Scan1 are taken low and Scan2 is held high. This routes the current that is flowing through drive transistor TD into sense line Vref. Current sensing circuitry within the compensation circuits of display driver circuitry 20B measures the amount of current flowing through transistor TD so that the performance of transistor TD may be assessed. As with the scenario of FIG. 2, the compensation circuitry of display driver circuitry 20B can use current measurements such as these to compensate pixels 22 of FIG. 8 for aging effects (e.g., aging that affects the amount of drive current Id that transistor TD produces for a given Vgs value).

After sensing operations are complete, data may be loaded from data line Data onto Node2 by taking EM and Scan1 high while holding Scan2 high. Pixel 22 may be placed in emission mode after data has been loaded by taking EM, Scan1, and Scan2 low, thereby turning on transistor TE and turning off transistors T1 and T2.

Because the EM, Scan1, and Scan2 signals are identical (i.e., because transistor T2 is an n-channel transistor like transistor T1), the functions of these signals can be implemented using a single combined signal that is carried on a single signal line (i.e., a single signal EM/Scan1/Scan2 can replace the separately adjusted EM, Scan1, and Scan2 signals of pixel 22 of FIG. 2). The configuration for pixel 22 of FIG. 5 therefore uses only a single gate control signal on a single associated horizontal control line in each row of pixels 22, which helps to minimize routing resources. Two vertical lines (Data and Vref) may be used to carry data, reference voltage signals, and current measurements in each column of pixels 22. The vertical lines of each column of a display with pixels 22 of the type shown in FIG. 8 operate independently of the vertical lines of the other columns (i.e., there are N independent lines Data and N independent lines Vref in a display having N columns of pixels 22).

Pixels with configurations of the type shown in FIGS. 2, 5, and 8 may be sensitive to variations in Vdde1 that arise from IR drops (ohmic losses) as Vdde1 is distributed across display 14. This is because the source voltage at the source S of drive transistor TD is coupled to Vdde1 and can vary as Vdde1 varies due to the position of each pixel 22 within display 14.

Figure 11:
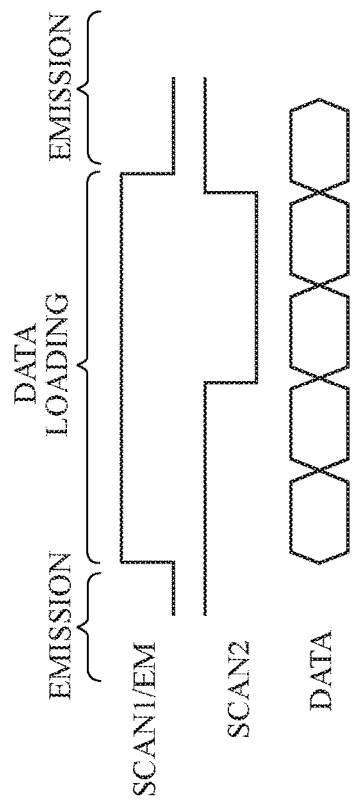
FIG. 11 is a circuit diagram of a further illustrative pixel for a display in accordance with an embodiment.

If desired, a pixel circuit of the type shown in FIG. 11 may be used for pixels 22 to help reduce performance variations due to Vdde1 variations. In the illustrative configuration of FIG. 11, T1 is coupled between line Vref and Node2, whereas transistor T2 is coupled between data line Data and Node1. Transistor T2 may therefore serve as a data loading transistor. Node2 is coupled to the gate of drive transistor TD.

During emission operations, the voltage on capacitor Cst1 (i.e., the voltage on Node2) is preferably maintained at a constant level to ensure a steady output level for light 32. During operations such as variable refresh rates operations, the refresh rate of display 14 may be relatively low (e.g., 1-5 Hz). To prevent transistor leakage current that might adversely affect the stability of the data voltage at Node2, transistor T1 may be implemented using a semiconducting-oxide transistor (e.g., a n-channel semiconducting-oxide transistor). Transistors TE, TD, and T2 may be p-channel silicon transistors. Because transistor T2 is a silicon transistor, data may be rapidly loaded from data line Data to Node1.

Unlike the arrangements of FIGS. 2, 5, and 8, source S of drive transistor TD of FIG. 11 is connected to Node1, rather than Vdde1. The level of voltage Vdde1 may vary due to IR loses as Vdde1 is distributed across display 14, but the voltage Vs on source S will not vary across display 14 (i.e., Vs will be independent of the position of pixel 22 within display 14) because the voltage Vs is established by loading a predetermined reference voltage onto Node1 via transistor T2 from data line Data.

Figure 12:
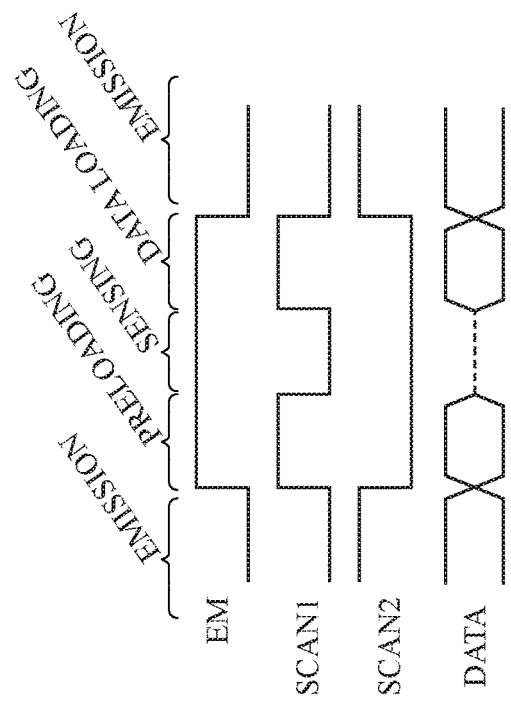
FIGS. 12 and 13 are timing diagrams showing illustrative signals involved in operating a display with pixels of the type shown in FIG. 11 in accordance with an embodiment.

A signal timing diagram showing signals associated with loading data from data line Data onto storage capacitor Cst1 at Node1 of pixel 22 of FIG. 11 is shown in FIG. 12.

During normal operation (emission operations), EM is held low by display driver circuitry 20B, so transistor TE is on. Scan1 is low to maintain transistor T1 in an off state. Scan2 is high to maintain transistor T2 in an off state. With TE on, the data value on node Node1 (and the voltage on Node2) establishes a desired Vgs value across gate G and source S of drive transistor TD, thereby setting the magnitude of drive current Id for light-emitting diode 30.

During data loading operations, EM is taken high by circuitry 20B to turn off transistor TE and block current Id. While EM is high, circuitry 20B takes signal Scan1 high to turn transistor T1 on. With transistor T1 on, Node2 is precharged to a predetermined voltage, thereby establishing a known gate voltage Vg at Node2 of transistor TD. Scan2 is initially high, which holds T2 off. When Scan2 is taken low (which may take place one row time before emission starts, two row times before emission starts, or at any other suitable time), transistor T2 is turned on and a desired data value is loaded from data line Data to Node1 via transistor T2. Emission operations may then be resumed by taking EM low, taking Scan1 low, and taking Scan2 high.

Figure 13:
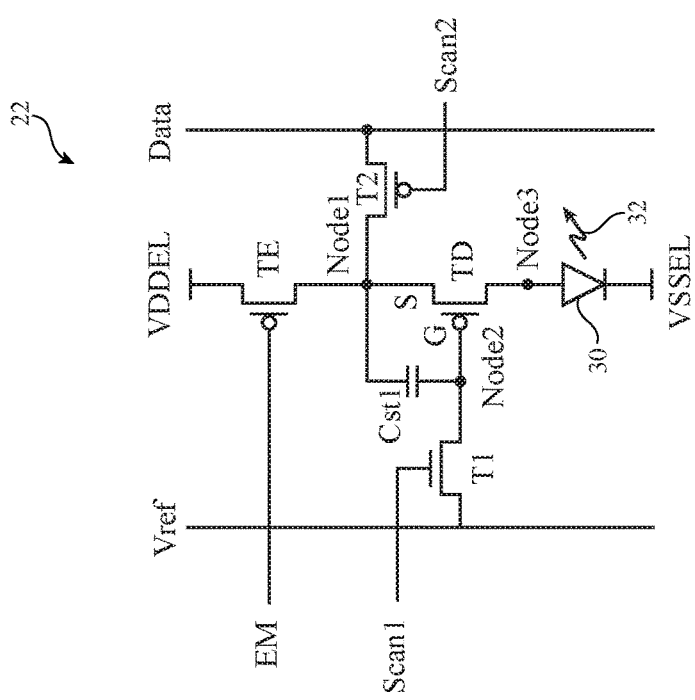

A signal timing diagram showing signals associated with periodic current sensing operations for pixel 22 of FIG. 11 is shown in FIG. 13.

During preloading, EM is taken high to prevent current from flowing through light-emitting diode 30 while Scan1 is taken high and Scan2 is taken low. With Scan2 low, transistor T2 is turned on and known reference data ("sense data") is loaded from line Data onto Node1. With Scan1 high, transistor T1 is turned on and a predetermined voltage (e.g., −5.5V or other suitable value) is provided from reference voltage line Vref to Node2. This establishes known conditions for operating drive transistor TD (e.g., a predetermined Vgs value).

During sensing operations, EM is held high, Scan1 is taken low, and Scan2 is held low. This holds TE off, turns off T1, and holds T2 on, thereby routing the current that is flowing through drive transistor TD through line Data, which is therefore serving as a sense line. Current sensing circuitry within the compensation circuits of display driver circuitry 20B measures the amount of current flowing through transistor TD via line Data, so that the performance of transistor TD may be assessed. Current sensing may take place over a time period of 100 microseconds or other suitable time period. The compensation circuitry of display driver circuitry 20B can use current measurements such as these to compensate pixels 22 for aging effects (e.g., aging that affects the amount of drive current Id that transistor TD produces for a given Vgs value).

After current sensing operations are complete, data may be loaded into pixel 22 by holding EM high to turn off transistor TE, by taking Scan1 high to turn on transistor T1 and thereby transfer a predetermined voltage from Vref to Node2, and by holding Scan2 low to hold transistor T2 on so that a desired data signal passes from data line Data to Node1. Pixel 22 may be placed in emission mode after data has been loaded by taking EM low to turn on transistor TE, taking Scan1 low to turn off transistor T1, and taking Scan2 high to turn off transistor T2.

The voltage range of signal EM may be −10V to 8V, may be −8V to 8 V, or may be any other suitable voltage range. The voltage of Vdde1 may be 5−8 V or other suitable positive power supply voltage level. The voltage of Vsse1 may be −2 V or other suitable ground power supply voltage level. The voltage range of the signals on line Data may be −4.5 V to −0.3 V or other suitable voltage range. The voltage range of Scan2 may be −10V to −8V, may be −12V to −4V, or may be other suitable voltage range. The voltage range of Scan1 may be −10V to −8V, may be −8V to 8V, or may be other suitable voltage range.

The configuration for pixel 22 of FIG. 2 uses three gate control signals (EM, Scan1, and Scan2) on three horizontal control lines in each row of pixels 22 and routes data, reference voltage signals, and current measurements using two vertical lines: Vref and Data in each column of pixels 22. One of the vertical lines (line Data) is a shared line that is used both for current sensing operations and for data loading operations. There is preferably a separate Data line in each column of pixels 22 in display 14. The other of the vertical lines (line Vref) associated with pixels 22 is part of a global path that may be used to distribute a shared voltage to all of pixels 22 in display 14 in parallel. Because Vref is a global signal path, only a single Vref signal needs be provided by display driver circuitry 20A to pixels 22 (i.e., there is a reduced need for signal routing resources between display driver circuitry 20B and pixels 22 compared to scenarios in which separate Vref signal lines are used for respective columns) Only one individual vertical signal line Data need be provided in each column, rather than the two individual vertical signal lines used in arrangements of the type shown in FIGS. 2, 5, and 8. The arrangement of FIG. 11 therefore exhibits low display driver circuitry fan out.

Due to the use of a low-leakage current semiconducting-oxide transistor for transistor T1, the refresh rate of display 14 may be lowered to a low rate (e.g., 1-5 Hz) during variable refresh rate operations. Charging times (i.e., the amount of time associated with charging Node1 to a desired value during data loading operations) may be minimized by using a silicon transistor to implement transistor T2. The pixel arrangement of FIG. 11 is also insensitive to variations in Vdde1 (e.g., variations due to IR drops), because both Node1 and Node2 are actively loaded with desired voltages during data loading, thereby establishing a desired gate-source voltage across drive transistor TD without using Vdde1.

FIG. 14 is a diagram of an illustrative pixel circuit with five transistors and one capacitor. Drive transistor TD is coupled in series with emission enable transistors TE1 and TE2 and with light-emitting diode 44 (e.g., an organic light-emitting diode) between positive power supply terminal 40 and ground power supply terminal 42. Horizontal control signals (gate signals) such emission enable control signals EM1 and EM2 may be used to control transistors TE1 and TE2, respectively. Horizontal control signals (gate signals) such as scan control signals SCAN1 and SCAN2 may be used to control switching transistors TS1 and TS2, respectively. Transistor TS1 may be, for example, a semiconducting-oxide transistor and transistors TS2, TE1, TE2, and TD may be silicon transistors (as an example). Capacitor Cst1 may be coupled between Node2 (at the gate of drive transistor TD) and Node1 (at the source of transistor TD). The line Vref may be used to supply a reference voltage to a column of pixels 22. Data signals (D) may be supplied to pixel 22 using data line Data.

FIG. 15 is a timing diagram showing signals involved in operating a display with pixels of the type shown in FIG. 14. As shown in FIG. 15, on-bias stress may be applied during the operations of on-bias stress period 200, data writing may be performed during data writing period 202, and emission operations may be performed during emission period 204.

Figure 16:
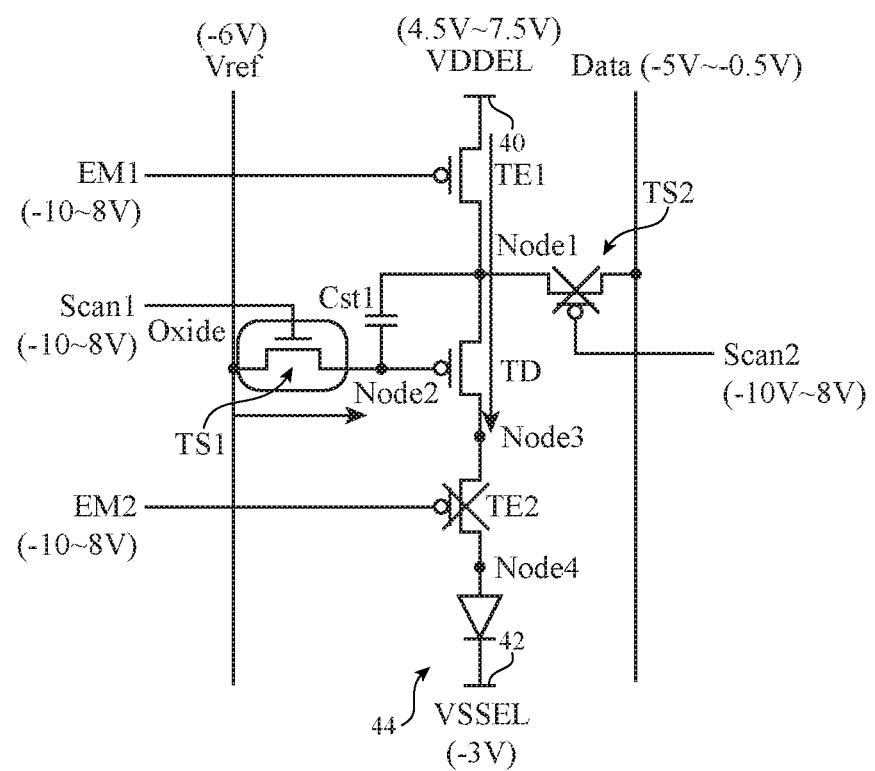
FIG. 16 is a diagram of the pixel circuit of FIG. 14 during on-bias stress operations in accordance with an embodiment.

FIG. 16 is a diagram of the pixel circuit of FIG. 14 during on-bias stress period 200. During this period, transistor TE2 is turned off to prevent drive current from flowing through diode 44 and transistor TS1 is turned on to supply on-bias stress to the gate of drive transistor TD to precondition transistor TD. Voltage Vgs of transistors TD is high because TE1 is on and Node1 is at Vdde1 and because TS1 is on and Node2 is at Vref.

Figures 17, 18:
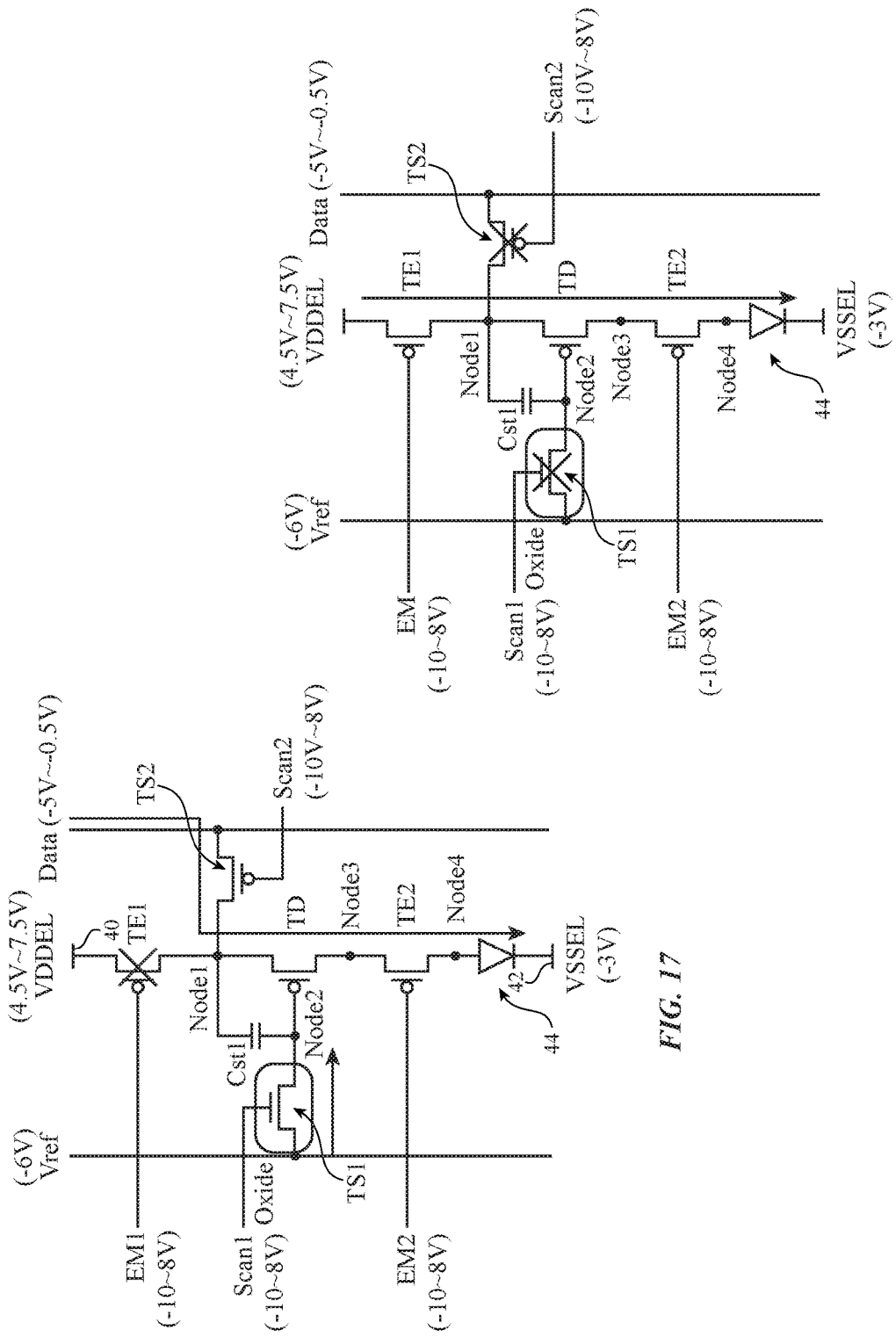
FIG. 17 is a diagram of the pixel circuit of FIG. 14 during data writing operations in accordance with an embodiment.
FIG. 18 is a diagram of the pixel circuit of FIG. 14 during emission operations in accordance with an embodiment.

FIG. 17 is a diagram of the pixel circuit of FIG. 14 during data writing operations (period 202 of FIG. 15). During data writing, transistor TS1 is initially turned on to load a known reference voltage Vref onto Node2 while transistor TS2 is turned on to load a data signal (sometimes referred to as Vdata, Data, or signal D) onto Node1. Transistors TE1 is turned off to isolate Node1 from Vdde1. This creates a voltage Vdata–Vref across capacitor Cst1. Transistor TS1 and transistor TS2 are then turned off and transistor TE1 is turned on, as shown in FIG. 18. With TE1 on, the voltage at Node1 is taken to Vdde1. The voltage across capacitor Cst1 does not change instantaneously, so when Node1 is taken to Vdde1, Node2 is taken to Vdde1–(Vdata–Vref). Current flow through diode 44 and therefore light emission 46 is therefore proportional to Vdata during emission period 204.

FIGS. 19, 20A, 20B, 21, and 22 illustrate how display driver circuitry 20 may compensate display 14 for variations in the threshold voltage Vt of drive transistors such as transistor TD in pixels 22 of display 14.

Figures 19, 20A:
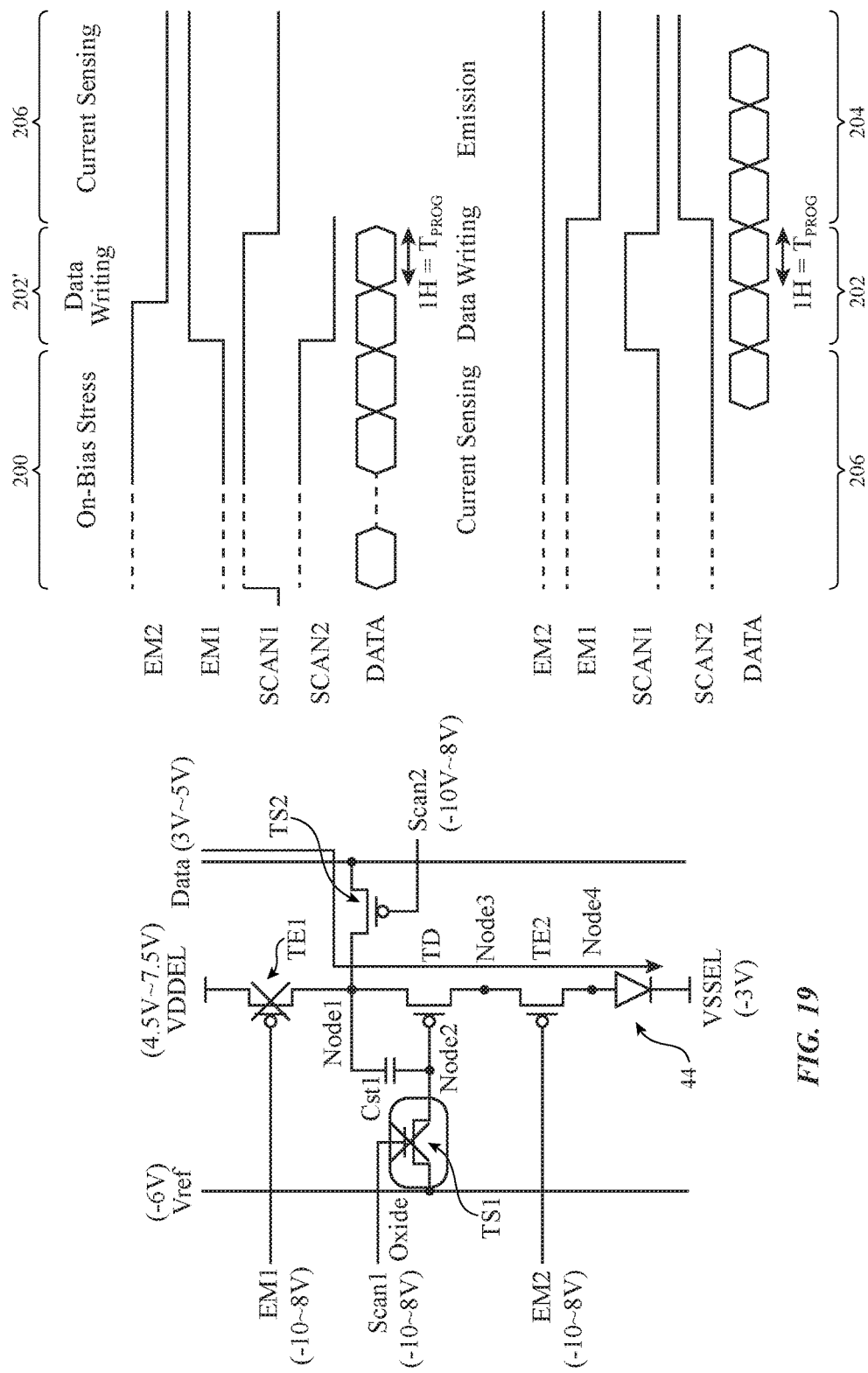
FIG. 19 is diagram of the pixel circuit of FIG. 14 when gathering threshold voltage information in accordance with an embodiment.
FIGS. 20A and 20B are timing diagrams showing signals involved in operating a display with pixels as shown in FIG. 14 in accordance with an embodiment.

FIG. 19 is diagram of the pixel circuit of FIG. 14 when gathering threshold voltage information in accordance with an arrangement of the type that may sometimes be referred to as a "current sensing" arrangement. FIG. 20A is a timing diagram showing signals involved in operating gathering the threshold voltage information. As shown in FIG. 20A, on-bias stress may be applied to transistor TD during on-bias stress period 200. During period 202', predefined data for use during threshold voltage compensation operations may be loaded into pixel 22 (i.e., a known voltage may be applied across capacitor Cst as described in connection with loading Vdata onto Node1 in connection with FIG. 17). Image data may be loaded into pixel 22 during data writing period 202 and the loaded image data may be used to control the amount of light emitted by diode 44 during emission period 204. Between periods 202' and 202, display driver circuitry 20 may, during sensing period 206, measure the threshold voltage Vt of drive transistor TD. To determine the threshold voltage Vt of transistor TD, a known reference data value Vref is written during period 202'. Then current flow on data line Data is measured with a current sensor and threshold voltage Vt is computed from the measured current. During period 202, data that has been externally compensated for any variations in Vt may then be written into pixel 22. Each of the pixels 22 in display 14 such as pixel 22 of FIG. 14 can be compensated for any measured variation in threshold voltage Vt by adjusting the value of the image data that display driver circuitry 20 supplies to pixel 22 during period 202 (i.e., display driver circuitry 20 may implement an external threshold voltage compensation scheme).

FIG. 19 shows the operation of pixel 22 during sensing period 206 (sometimes referred to as threshold voltage sensing or current sensing). As shown in FIG. 19, transistor TE1 is turned off during period 206 to isolate Node1 from Vdde1. Transistor TS1 is turned off to allow Node2 to float. During period 206, the gate-source voltage Vgs across transistor TD is determined by the known data loaded into capacitor Cst1 during period 202'. Transistor TS2 is on, so the known data on transistor TD (and the threshold voltage Vt of transistor TD) determines the current flowing on the Data line. Display driver circuitry 20 measures this current during period 206 to ascertain the value of threshold voltage Vt. Appropriate threshold voltage compensation operations may then be performed by adjusting the values of the image data loaded into pixel 22 during data writing operations 202 (FIG. 20A).

Figures 21, 22:
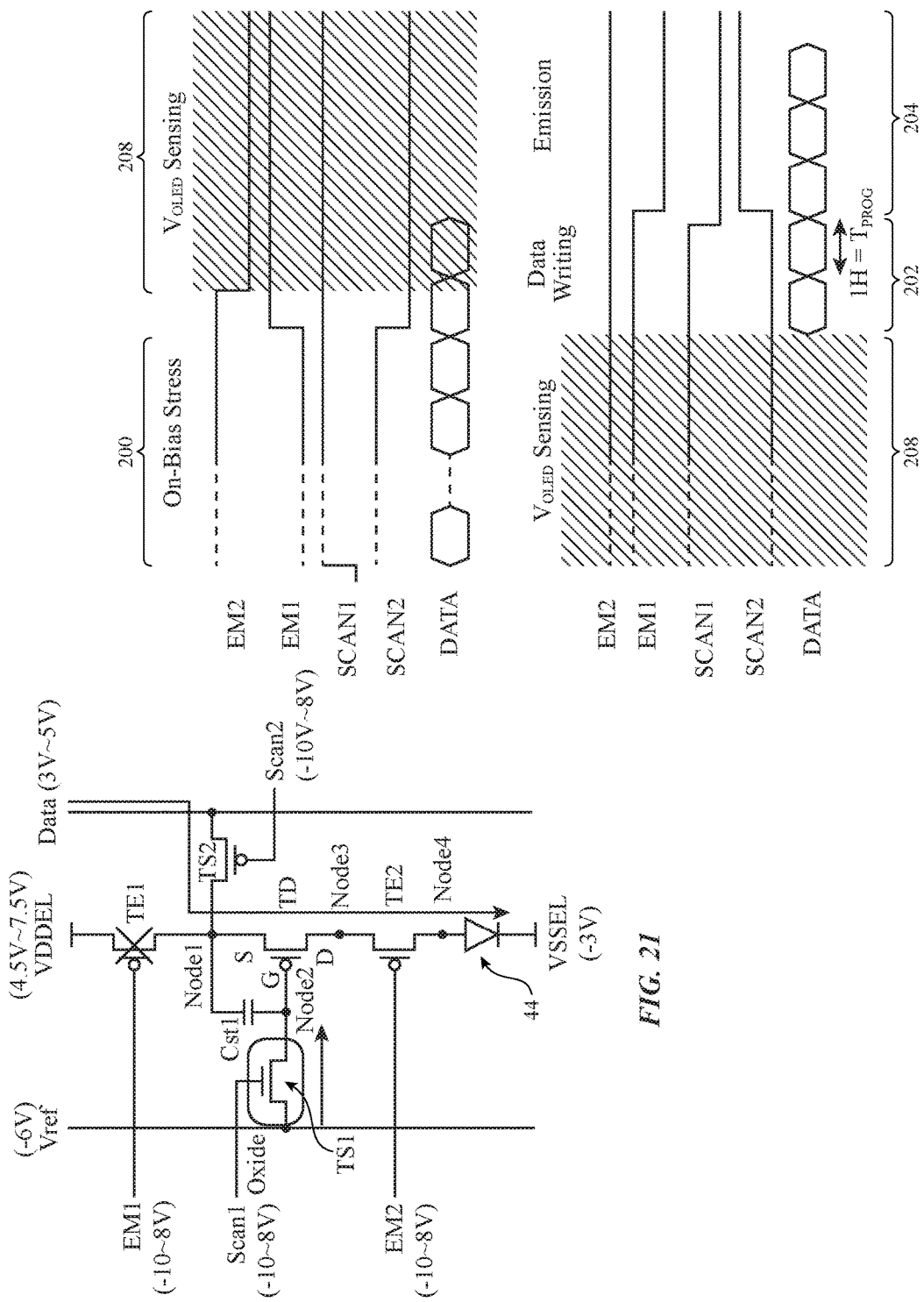
FIG. 21 is a diagram of the pixel circuit of FIG. 14 when gathering threshold voltage information in accordance with another embodiment.
FIG. 22 is a timing diagram showing signals involved in operating a display with pixels as shown in FIG. 21 in accordance with an embodiment.

FIG. 21 is a diagram of the pixel circuit of FIG. 14 when gathering threshold voltage information in accordance with another illustrative external threshold voltage compensation scheme (i.e., a scheme of the type that may sometimes be referred to as a "voltage sensing" scheme). FIG. 22 is a timing diagram showing signals involved in operating a display with pixels as shown in FIG. 21.

As shown in FIG. 22, on-bias stress may be applied to transistor TD during on-bias stress period 200. Image data may be loaded into pixel 22 during data writing period 202 and the loaded image data may be used to control the amount of light emitted by diode 44 during emission period 204. Between periods 200 and 202, display driver circuitry 20 may, during sensing period 208, measure the threshold voltage Vt of drive transistor TD. First transistor TS1 may be turned on to take Node2 to Vref. This establishes a known current on data line Data. Transistors TD and TE2 are on, so current flows through light-emitting diode 44. The voltage drop across transistors TE2, TD, and TS2 is small, so the resulting voltage Voled on data line Data can be measured. Threshold voltage Vt can then be obtained from the known values of the flowing current and Voled. Pixel 22 can be compensated for any variation in threshold voltage Vt that is measured during sensing period 208 by adjusting the value of the image data that display driver circuitry 20 supplies to pixel 22 during period 202 (i.e., display driver circuitry 20 may implement an external threshold voltage compensation scheme).

FIG. 21 shows the operation of pixel 22 during sensing period 208 (sometimes referred to as voltage sensing or Voled sensing). As shown in FIG. 21, transistor TE1 is turned off during period 208 to isolate Node1 from Vdde1. Transistor TS1 is turned on to supply reference voltage Vref to Node2 at gate G of drive transistor TD. A known data voltage Vdata is supplied to Node1 at source S of drive transistor TD through the Data line and through transistor TS2, which is on. This establishes a known gate-source voltage Vgs across drive transistor TD. The known Vgs value and the threshold voltage Vt of transistor TD determine the amount of current flowing through diode 44 from the Data line. Display driver circuitry 20 measures this current during period 208 to ascertain the value of threshold voltage Vt. Appropriate threshold voltage compensation operations may then be performed by adjusting the values of the image data loaded into pixel 22 during data writing operations 202 (FIG. 22).

Figure 20B:
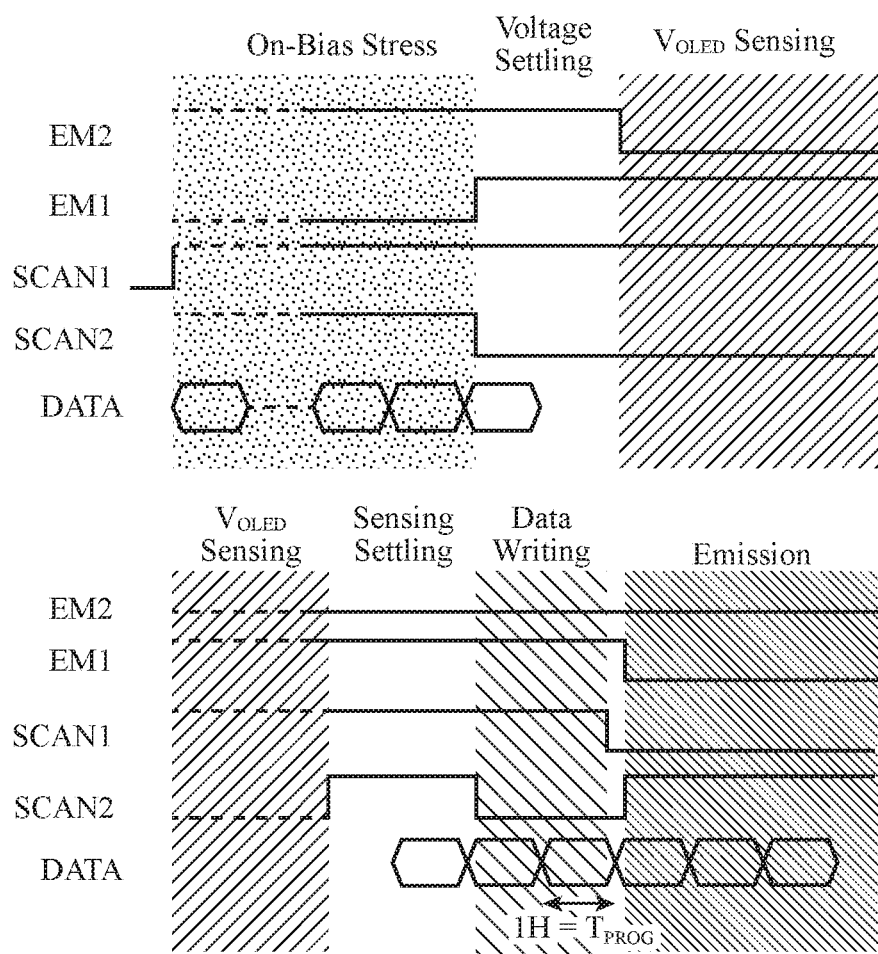

If desired, a settling time may be inserted into the process of FIG. 20A as illustrated in FIG. 20B. The settling time allows the voltage on data line Data to be established at a high voltage near to Vdde1 to allow light-emitting diode 44 to mimic normal emission operations during current sensing. Sensing settling operations allow analog-to-digital converter circuitry in circuitry 20 that is coupled to data line Data sufficient time to sample the voltage on line Data.

Figures 23, 24:
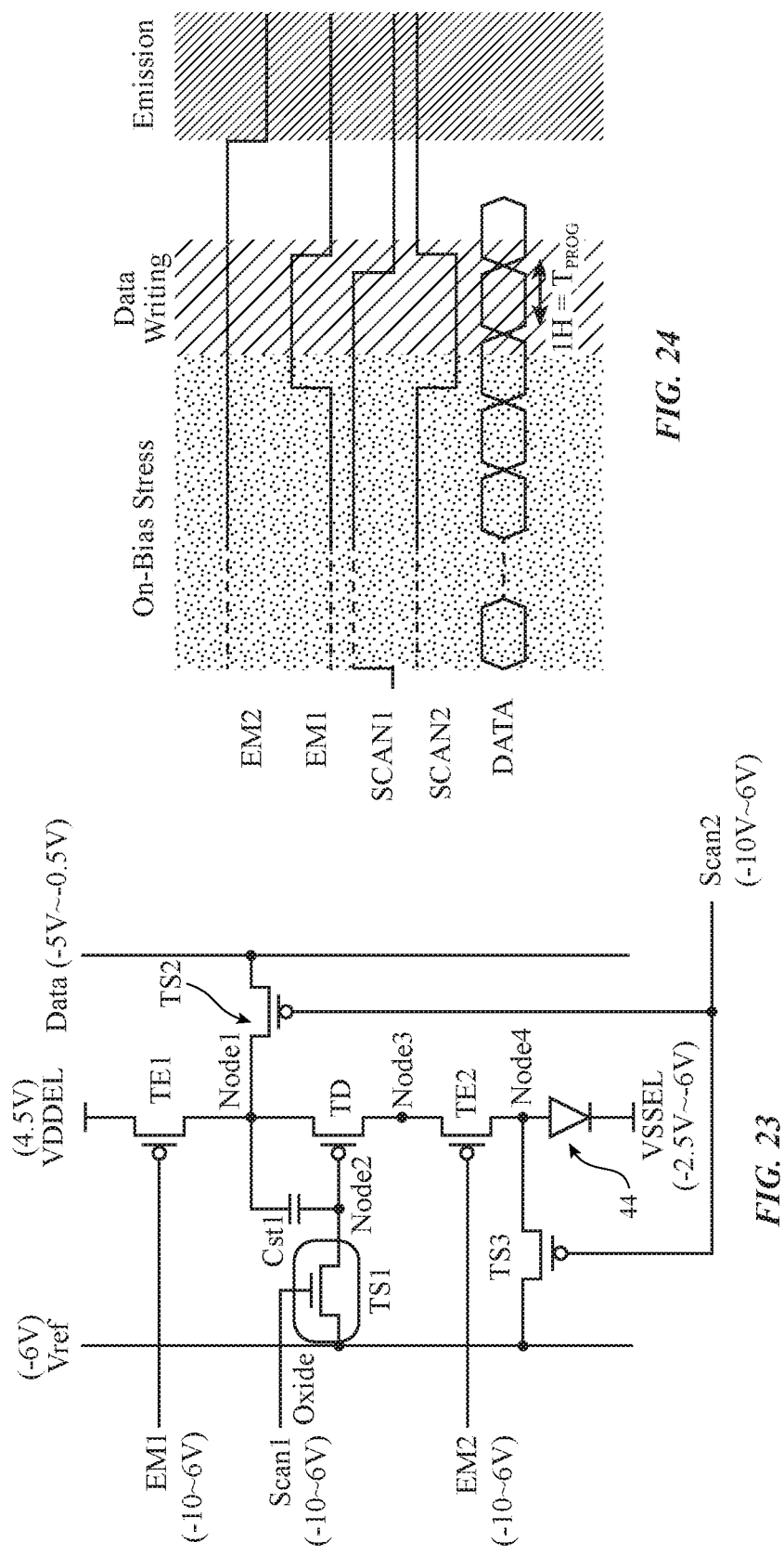
FIG. 23 is a circuit diagram of an illustrative pixel with a bypass transistor in accordance with an embodiment.
FIG. 24 is a diagram showing control signals of the type that may be used in operating the pixel of FIG. 23 in accordance with an embodiment.

FIG. 23 shows an illustrative 6T1C configuration for pixel 22. Transistor TS3 and transistor TS2 may be controlled by scan signal Scan2 as shown in FIG. 23, or the gate of transistor TS3 may be controlled using a previous scan line signal (e.g., Scan2(n−1) from a previous row). Transistor TS3 in FIG. 23 may be used to reset Node4 at the anode of light-emitting diode 44. The parasitic capacitance of light-emitting diode 44 can discharge Node4 rapidly (e.g., from about 2.5 volts to −6 volts) to turn off light-emitting diode 44 quickly during data writing. This helps lower Node4 below the threshold voltage of light-emitting diode 44 and helps prevent light-emitting diode 44 from turning on due to leakage from drive transistor TD during the displaying of black images on display 14. FIG. 24 show illustrative control signals that may be used in operating pixel 22 of FIG. 23 during on-bias stress, data writing, and emission periods.

Figure 25:
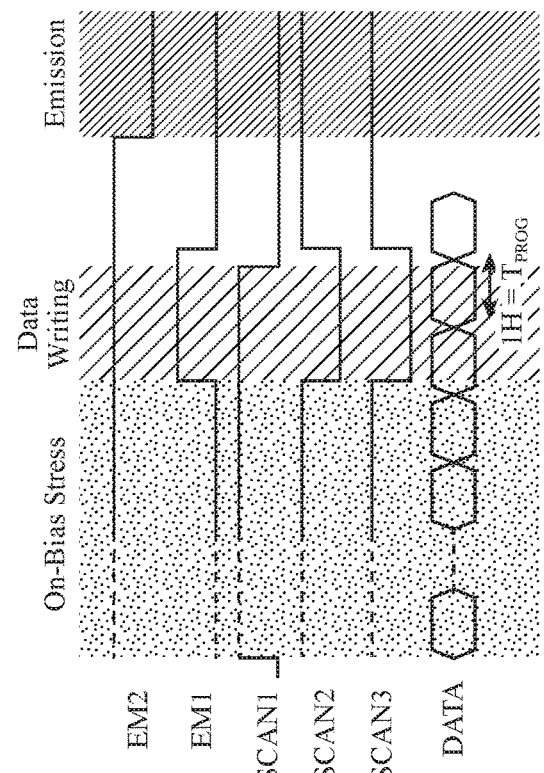
FIG. 25 is a circuit diagram of another illustrative pixel with a bypass transistor in accordance with an embodiment.
Figure 26:
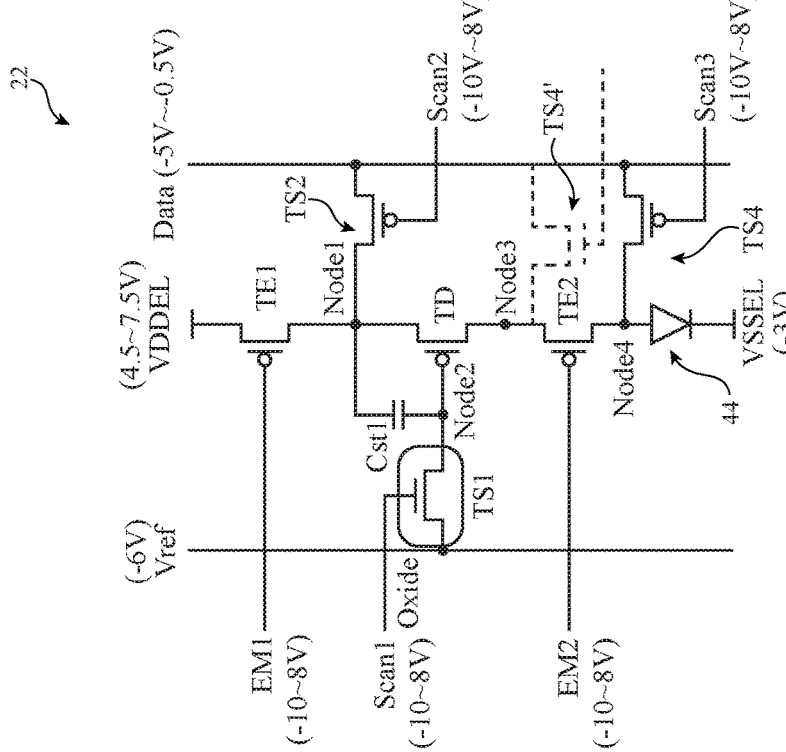
FIG. 26 is a diagram showing control signals of the type that may be used in operating the pixel of FIG. 25 in accordance with an embodiment.
Figure 27:
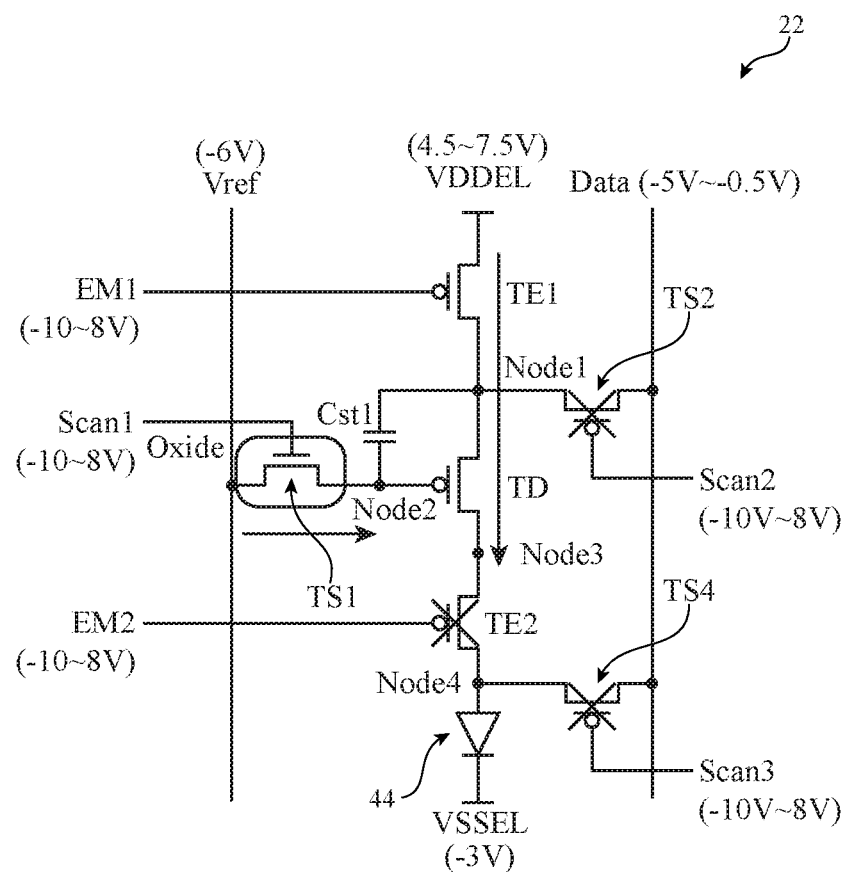
FIGS. 27, 28, 29, 30, and 31 show illustrative operations for a pixel of the type shown in FIG. 25.
Figures 28, 29:
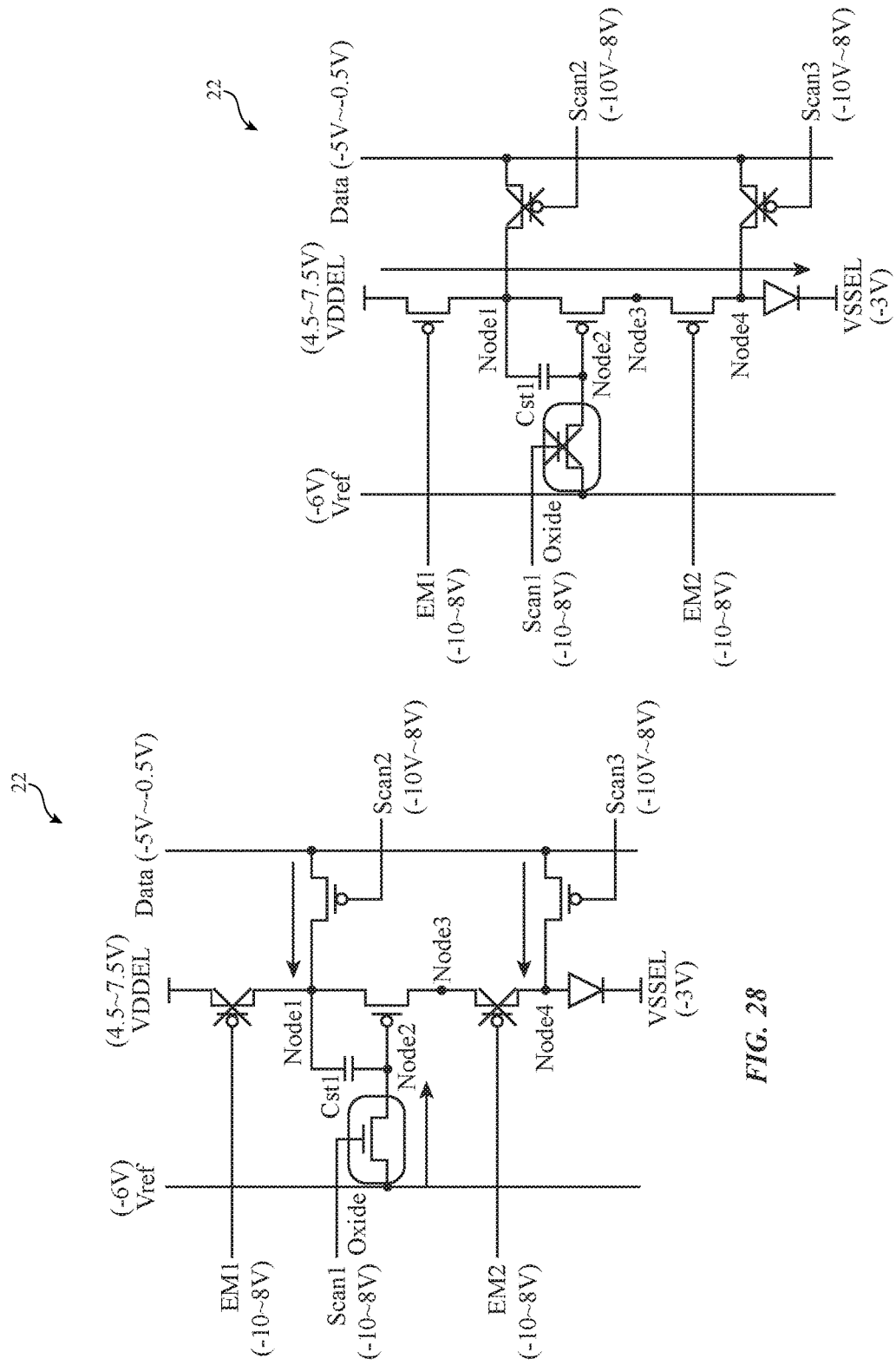
Figure 30:
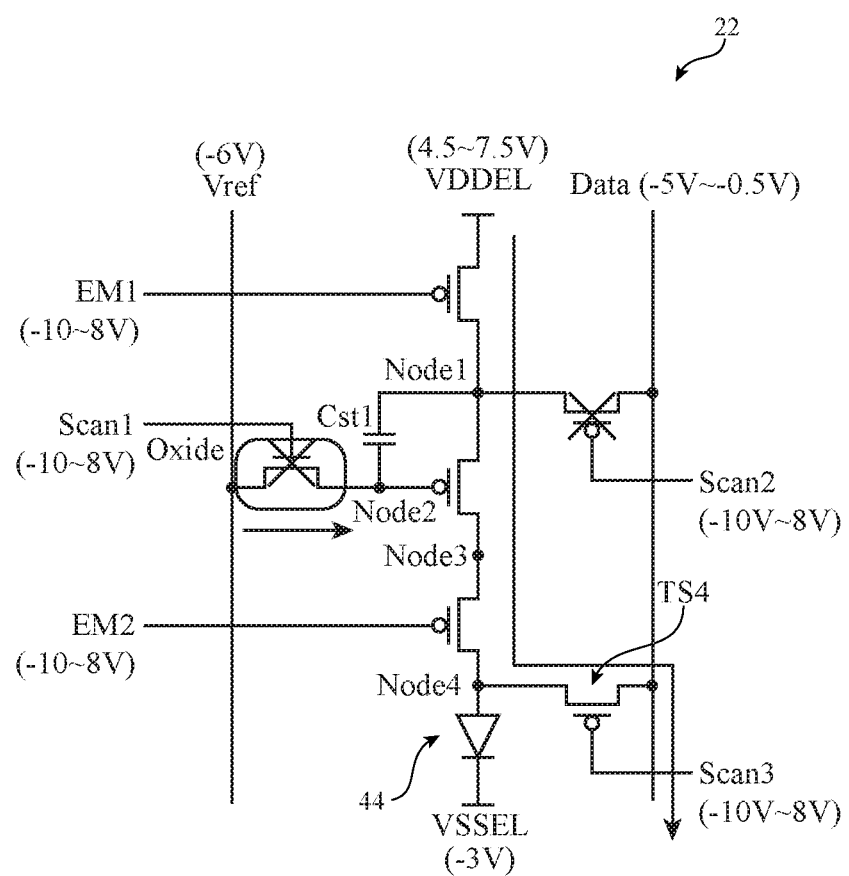
Figure 31:
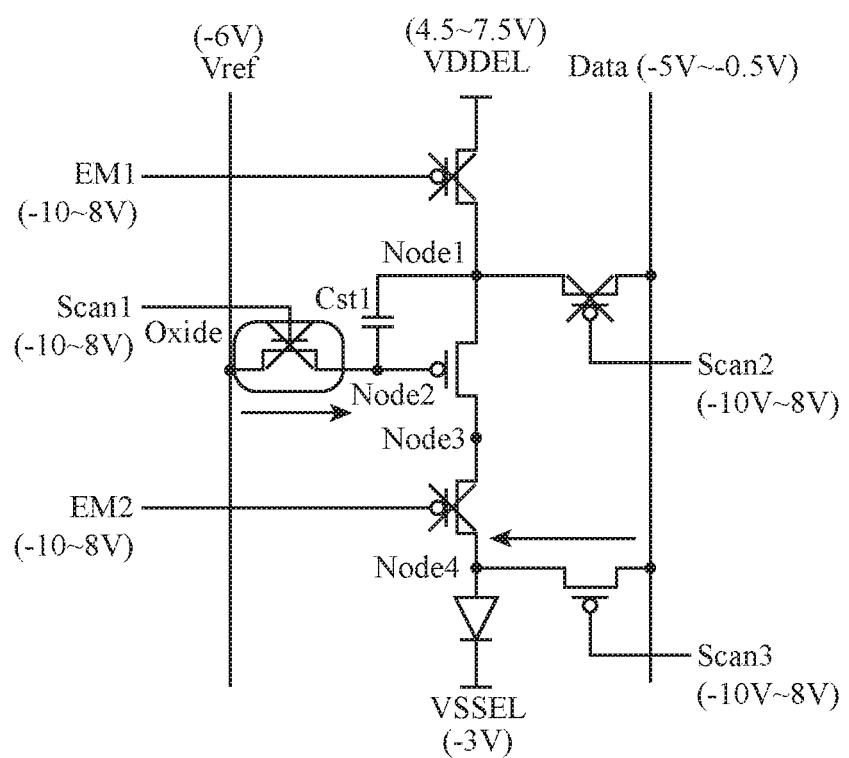

In the illustrative configuration for pixel 22 of FIG. 25, TS3 has been replaced by bypass transistor TS4 (controlled by Scan3) to help prevent current from passing through transistor TD and undesirably illuminating diode 44 while performing current sensing operations on transistor TD. If desired, transistor TS4 may be placed in alternate location TS4'. The example of FIG. 25 is merely illustrative. FIG. 26 shows control signals that may be used in operating pixel 22 of FIG. 25. FIG. 27 shows pixel 22 of FIG. 25 during on-bias stress operations. FIG. 28 shows pixel 22 of FIG. 25 during data writing. FIG. 29 shows pixel 22 of FIG. 25 during emission operations. FIG. 30 shows pixel 22 of FIG. 25 during current sensing operations to measure Vt of TD (in which light-emitting diode 44 is not turned on due to the current bypass path established by transistor TS4. In the example of FIG. 31, transistor TS4 is being used in a voltage sensing scheme. In the voltage sensing scheme of FIG. 31, transistor TS3 is used to avoid creating a voltage drop over transistors TS2, TD, and TE2 to enhance sensing accuracy.

Figure 32:
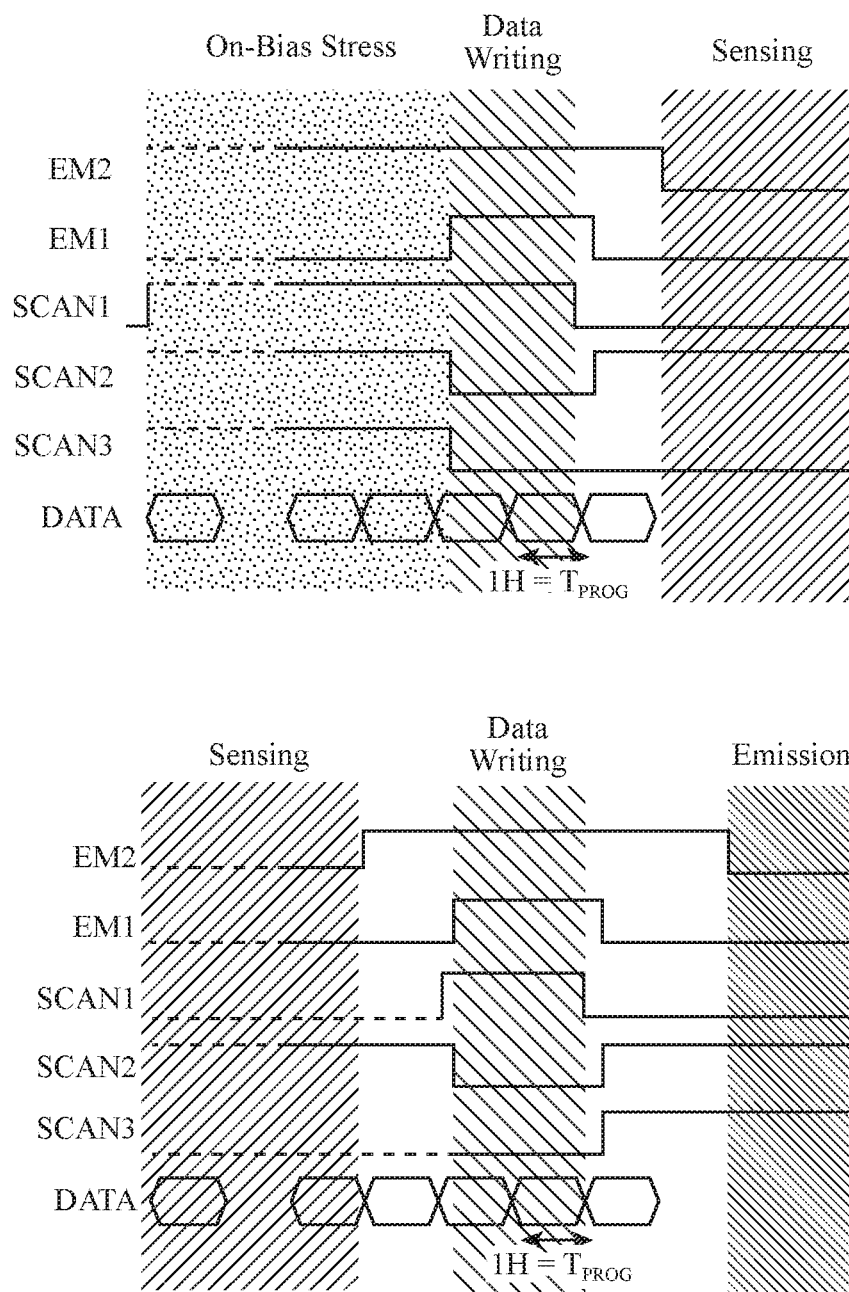
FIG. 32 is a diagram showing how current sensing operations of the type described in connection with FIG. 30 may be performed.

FIG. 32 is a diagram of the type shown in FIG. 26 showing how current sensing operations of the type described in connection with FIG. 30 may be performed.

As these examples demonstrate, an additional transistor may be incorporated into pixel 22 to create a current bypass path during threshold voltage measurements on drive transistor TD. Because the additional transistor is used in creating a bypass path that bypasses light-emitting diode 44, the additional transistor may sometimes be referred to as a bypass transistor. The bypass transistor may be, for example, a silicon transistor (i.e., a transistor with a silicon active region).

The foregoing is merely illustrative and various modifications can be made by those skilled in the art without departing from the scope and spirit of the described embodiments. The foregoing embodiments may be implemented individually or in any combination.

What is claimed is:

1. A pixel circuit comprising:
   a positive power supply terminal;
   a ground power supply terminal;
   a light-emitting diode (LED) that is connected between the positive power supply terminal and the ground power supply terminal;
   a drive transistor that is connected in series with the light-emitting diode;
   an emission transistor that is connected in series with the drive transistor and the light-emitting diode, wherein the emission transistor is interposed between the light-emitting diode and the drive transistor; and
   a semiconducting-oxide switching transistor that is coupled to a gate of the drive transistor.

2. The pixel circuit defined in claim 1, wherein the semiconducting-oxide switching transistor is coupled between the gate of the drive transistor and a first signal line.

3. The pixel circuit defined in claim 2, wherein the first signal line is a reference voltage line.

4. The pixel circuit defined in claim 3, further comprising a storage capacitor that is coupled to a first node that is interposed between the semiconducting-oxide switching transistor and the gate of the drive transistor.

5. The pixel circuit defined in claim 4, wherein the storage capacitor is coupled to a second node and wherein the display pixel further comprises:
   an additional switching transistor that is coupled between the second node and a second signal line.

6. The pixel circuit defined in claim 5, wherein the second signal line is a data line.

7. The pixel circuit defined in claim 6, wherein the additional switching transistor is a first silicon transistor, wherein the emission transistor is a second silicon transistor.

8. The pixel circuit defined in claim 7, further comprising:
   a transistor coupled to a third node that is interposed between the light-emitting diode and the emission transistor.

9. The pixel circuit defined in claim 8, wherein the drive transistor is a third silicon transistor.

10. The pixel circuit defined in claim 9, wherein the transistor coupled to third node is a fourth silicon transistor.

11. The pixel circuit defined in claim 8, wherein the second node is in series with the drive transistor, the emission transistor, and the light-emitting diode.

12. A display, comprising:
    display driver circuitry;
    an array of pixels; and
    signal lines that convey signals between the display driver circuitry and the pixels, wherein each pixel includes:
       a light-emitting diode (LED) connected to a ground power supply terminal;
       a drive transistor coupled to the light-emitting diode;

a semiconducting-oxide switching transistor coupled between a gate terminal of the drive transistor and a first signal line of the signal lines;
a capacitor having first and second terminals, wherein the first terminal is connected to both the gate terminal of the drive transistor and the semiconducting-oxide switching transistor and wherein the second terminal is connected to a node; and
a silicon switching transistor coupled between the node and a second signal line of the signal lines.

13. The display defined in claim 12, wherein the first signal line is a reference voltage line.

14. The display defined in claim 12, wherein the second signal line is a data line.

15. The display defined in claim 12, further comprising:
a silicon emission transistor connected in series with the drive transistor and the light-emitting diode.

16. The display defined in claim 15, wherein the silicon emission transistor is interposed between the drive transistor and the light-emitting diode.

17. The display defined in claim 16, further comprising:
an additional silicon switching transistor that is coupled to a node that is interposed between the silicon emission transistor and the light-emitting diode.

18. A pixel circuit, comprising:
a reference voltage line;
a data line;
an emission transistor, a drive transistor, and a light-emitting diode (LED) that are serially connected between a positive power supply and a ground power supply;
a semiconducting-oxide switching transistor coupled between a gate terminal of the drive transistor and the reference voltage line;
a storage capacitor having a first terminal coupled between the semiconducting-oxide switching transistor; and the gate terminal of the drive transistor; and
a silicon switching transistor coupled between a second terminal of the storage capacitor and the data line.

19. The pixel circuit defined in claim 18, wherein the emission transistor is interposed between the drive transistor and the light-emitting diode.

20. The pixel circuit defined in claim 19, further comprising:
a transistor coupled to a node that is interposed between the emission transistor and the light-emitting diode.

* * * * *